US005962926A

United States Patent [19]

Torres et al.

[11] Patent Number: 5,962,926

[45] Date of Patent: Oct. 5, 1999

[54] SEMICONDUCTOR DEVICE HAVING MULTIPLE OVERLAPPING ROWS OF BOND PADS WITH CONDUCTIVE INTERCONNECTS AND METHOD OF PAD PLACEMENT

[75] Inventors: Victor Manuel Torres; Ashok Srikantappa; Laxminarayan Sharma, all of Austin, Tex.

[73] Assignee: Motorola, Inc., Schaumburg, Ill.

[21] Appl. No.: 08/940,605

[22] Filed: Sep. 30, 1997

[51] Int. Cl.[6] .......................... H01L 23/48; H01L 23/52; H01L 29/40

[52] U.S. Cl. .......................................... 257/786; 257/784

[58] Field of Search .................................... 257/786, 737, 257/738, 784

[56] References Cited

U.S. PATENT DOCUMENTS

| | | | |
|---|---|---|---|
| 4,990,996 | 2/1991 | Kumar et al. | 257/786 |
| 5,195,237 | 3/1993 | Cray et al. | 29/838 |
| 5,468,999 | 11/1995 | Lin et al. | 257/784 |
| 5,498,767 | 3/1996 | Huddleston et al. | 438/599 |
| 5,719,449 | 2/1998 | Strauss | 257/786 |

FOREIGN PATENT DOCUMENTS

| | | | |
|---|---|---|---|
| 63-244853 | 10/1988 | Japan | 257/786 |
| 1-137640 | 5/1989 | Japan | 257/786 |
| 2-184043 | 7/1990 | Japan | 257/48 |

OTHER PUBLICATIONS

Integrated Circuit Engineering Corporation; "Intel A80502–120 Pentium Processor", Construction Analysis Report No. SUB9506–02; p. 1 and Figure 4; Jun. 1995.

*Primary Examiner*—Mahshid Saadat
*Assistant Examiner*—Jhihan B. Clark
*Attorney, Agent, or Firm*—J. Gustav Larson; Robert L. King

[57] ABSTRACT

The present invention comprises a semiconductor device (20) having a active circuit (22) and a bond pad area (24). Within the bond pad area there are a plurality of rows of bond pads. Sets of bond pads (30–36) include one bond pad from each row. The bond pads (26) are uniquely positioned within the bond pad area (24) to allow for a first wire pitch between pads which are adjacent and in the same set, and a second wire pitch between pads which are adjacent and in different sets. A method of determining placement of the bond pads (26) is taught.

16 Claims, 8 Drawing Sheets

SEMICONDUCTOR DEVICE HAVING MULTIPLE OVERLAPPING ROWS OF BOND PADS WITH CONDUCTIVE INTERCONNECTS AND METHOD OF PAD PLACEMENT

FIELD OF THE INVENTION

This invention relates generally to semiconductor devices, and specifically to bond pad placement and packaging of a semiconductor device.

BACKGROUND OF THE INVENTION

In the semiconductor industry the need for high pin count semiconductor devices is well known. Often, high pin count requirements lead to designs which are pad limited. A pad limited design is one where the overall die size is determined by the number of pads, as opposed to core limited design which is generally limited by the number of transistors needed to implement a specific device function. Typically, semiconductor devices have a single row of bond pads with a constant pad pitch. The constant pad pitch is determined by the worst case packaging requirements of the semiconductor device. For example, for high pin count packages, the pad pitch is generally determined by the pads located closest to the corner of the die. It is these pads that generally require a maximum pad pitch in order to allow bonding tools to function without interfering with adjacent bond wires. Therefore, this worst case pad pitch spacing is used to determine how many pads fit along an edge of a semiconductor die. The problem with using a single row of bond pads which are uniformly spaced is that it causes larger die sizes.

A prior art improvement over the traditional single row of bond pads having constant pad pitches is the use of constant wire pitches as taught in U.S. Pat. No. 5,498,767. A constant wire pitch device maintains a constant wire pitch, while the pad pitch between adjacent pads varies. Constant wire pitch is defined to be the orthogonal distance from the center of a bond pad to the adjacent wire. By maintaining a constant wire pitch across the edge of the die, the bond pads are no longer constrained by the use of worst case pad spacing. As a result, smaller die sizes are achievable. However, even with the use of constant wire pitch configuration, it is often common for a single row of pads to be the limiting factor of the overall device size.

It has been proposed in the industry to use dual rows of bond pads in order to further optimize die size for pad limited designs. One such proposal, put forth in U.S. Pat. No. 5,468,999 uses multiple rows of bond pads forming orthogonal sets of pads. FIG. 4 of the '999 patent, illustrates how the semiconductor device effectively has three identical rows of bond pads. In other words the second row is a virtual copy of the first row, offset from the first row in a perpendicular direction from the die edge. While this does provide some die size advantages, it is problematic in that the structure requires using multiple loop heights in order to avoid the shorting of wires. Using multiple loop heights in the packaging process increases complexity, cost, and decreases reliability of the overall semiconductor device. In addition, this patent requires bonding wires to be bonded in a generally orthogonal direction. As a result, it is primarily for use with low pin count devices.

Another dual row proposal is put forth in U.S. Pat. No. 5,195,237 uses multiple rows of bond pads. FIG. 3 of the '237 patent, and FIG. 5 of the '999 patent, it is illustrated how the semiconductor device effectively has two identical rows of bond pads that are non-overlapping, or have coincident edges, in a direction perpendicular to the die edge. However, this prior art teaches the individual pads having a constant pad pitch within each row. As a result, the number of total pads available is limited in that a worst case pad pitch must be maintained.

Therefore, a semiconductor device and method which is capable of decreasing the die size in pad limited layouts, and optimizing the number of bond pads for a given die size would be beneficial.

Figure 1:
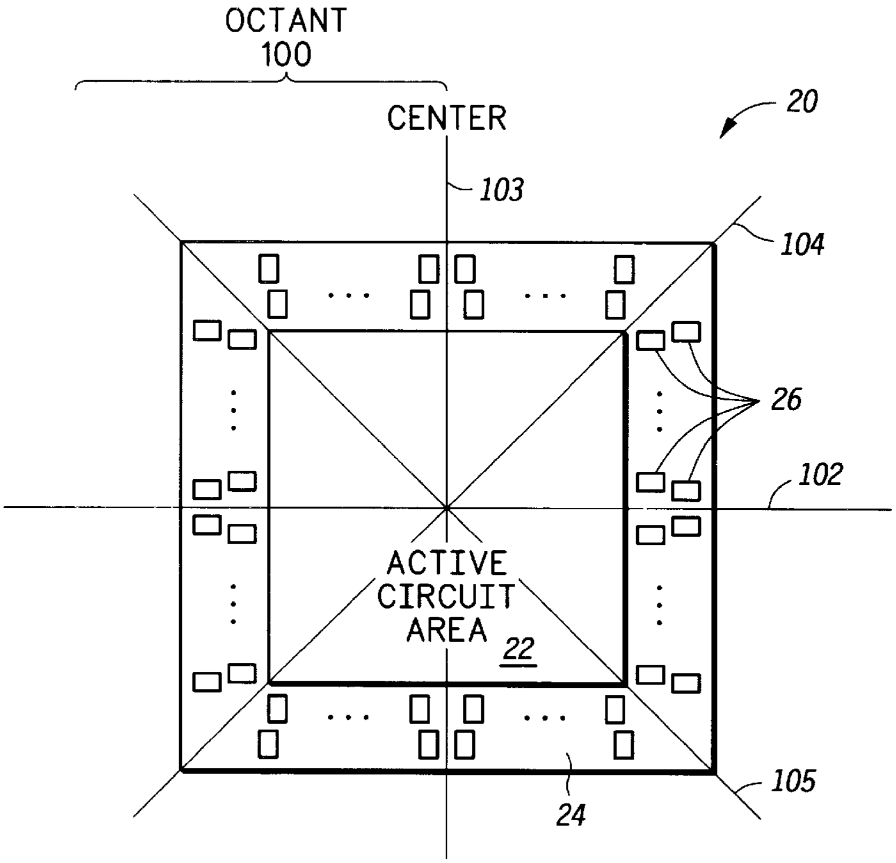
FIG. 1 illustrates a plan view of a semiconductor device divided into octants having two rows of bond pads.

It will be appreciated that for simplicity and clarity of illustration, elements illustrated in the drawings have not necessarily been drawn to scale. For example, the dimensions of some of the elements are exaggerated relative to other elements for clarity. Further, where considered appropriate, reference numerals have been repeated among the drawings to indicate corresponding or analogous elements.

DETAILED DESCRIPTION OF THE PRESENT INVENTION

The present invention uses a multiple row bond pad layout technique using dual constant wire pitches. A first constant wire pitch, of the dual constant wire pitches, is obtained between adjacent pads within a pad set. A second constant wire pitch, of the dual constant wire pitches, is obtained between adjacent pads associated with different pad sets. The present invention allows for smaller die area for pad limited designs over the prior art.

The present invention is best understood with reference to the figures. FIG. 1 illustrates a semiconductor device 20 having an active circuit area 22 for implementing specific application logic, and a periphery area 24 having bond pads 26 which can include input/output pins and power supply pins. The device 20 can be divided into octants by dissecting the device on center edge axes 103, 102, and corner edge axes 104, 105 axis. An octant 100 is identified which resides between the corner edge axis 105, and the center edge axis 103.

Figure 2:
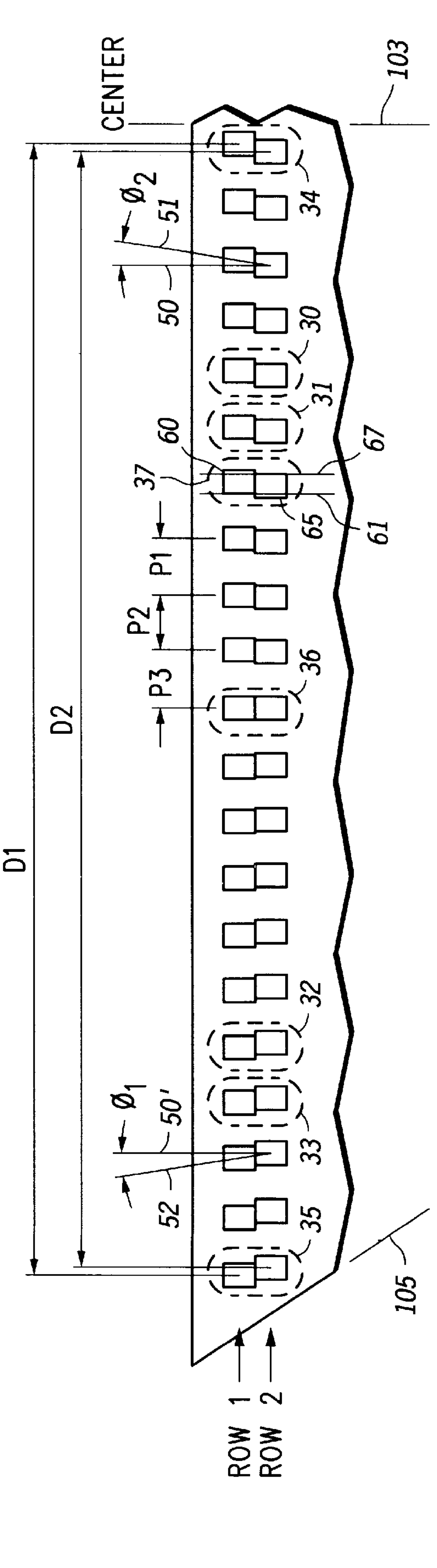
FIG. 2 illustrates a plan view of the bond pads associated with an octant of FIG. 1.

FIG. 2 illustrates the octant 100 of FIG. 1. The specific embodiment of FIG. 2 illustrates the use of dual constant wire pitches for two rows of bond pads. Beginning at the center axis 103 of the octant, adjacent bond pads are divided into specific sets. The number of sets will generally be equal to the number of pads of a given row. In other words, if Row1 and Row2 each have ten pads per octant, there would be ten sets of two pads each. Note, that it is not necessary for the rows to have identical pad counts, however, the number of sets will be limited by the row having the smaller number of pads. In the present embodiment, the elements of a set are over-lapping in that an axis coincident to a side of a pad intersects at least one other pad within the set. This is illustrated in FIG. 2 by set 37, where axis 61 of pad 60 intersects pad 65, while axis 67 of pad 65 intersects pad 60. Within each set, there will be a minimum overlap of approximately 25% or greater. Another way of explaining this relationship is that there is a common location coordinate between a first bond pad and at least one other pad within the same set. For example, for a two row implementation, both pads would have a common X coordinate, assuming the X-axis is parallel to the die edge associated with the bond pads.

As further illustrated in FIG. 2, each individual row has a varying pad pitch. For example, Row1 has a first pad pitch which varies between adjacent pads. In the embodiment illustrated, the first pad pitch is smaller near the center axis 103 and larger near the corner axis 105 of the die. For example pitch P1 is less than pitch P2 and pitch P2 is less than pitch P3. Row2 has a corresponding second pad pitch which also varies between adjacent pads. However, the first pad pitch does not vary the same as the second pad pitch.

In addition, each specific row has a varying rate of pitch increase between adjacent pads. For example, Row1 has a first pitch rate which varies. In other words, the value of pitch P3 less the value of pitch P2 is greater than the value of pitch P2 less the value of pitch P1. However, the Row2 has a second pitch rate which is less than the Row1 pitch rate. This should be intuitive in that the pitch D1 is greater than pitch D2 in FIG. 2, where D1 is the distance from the Row1 pad closest to the center axis 103 to the pad closest to the corner axis 105, and D2 is the distance from the Row2 pad closest to the center axis 103 to the pad closest to the corner axis 105.

Another characteristic of the present invention is that the pitch between set adjacent pads (set pad pitch) is greater for a set near the center edge of the octant, such as set 34, than the set pad pitch of a set near the center crossover point of the octant, such as set 36. Note, the term center crossover point will be discussed further below. Likewise, set pad pitch is greater for a set near the corner of the octant, such as set 35, than the set pad pitch of a set nearer the center crossover point of the octant, such as set 36. In other words, referring to FIG. 2, P1 is greater than P2, and P2 is greater than P3.

Yet another characteristic of the present invention is that for a set near the center edge of the octant, a positive angle theta2 is created between a line 50, which is orthogonal to the edge of the die, and a line 51 which intersects the centers of the bond pads of a set. Note that for other embodiments of the present invention, having 3 or more rows, only two of the pads need to be used to create the intersecting line. In other words, not all pads within a set need to be linearly aligned. However, nearer the corner of the octant, a negative angle theta1 is created between a line 50', which is orthogonal to the edge of the die, and a line 52 which intersects the centers of the bond pads of a set. Therefore, there is a center crossover point where there is either a pad set having an angle, theta, of zero degrees, or there are adjacent pad sets having angles of opposite orientation relative to the orthogonal line 50, 50' (i.e. one positive one negative). Note that some octants will be reversed or mirrored such that the negative angle is near the center axis, and the positive angle is near the corner axis.

Figure 3:
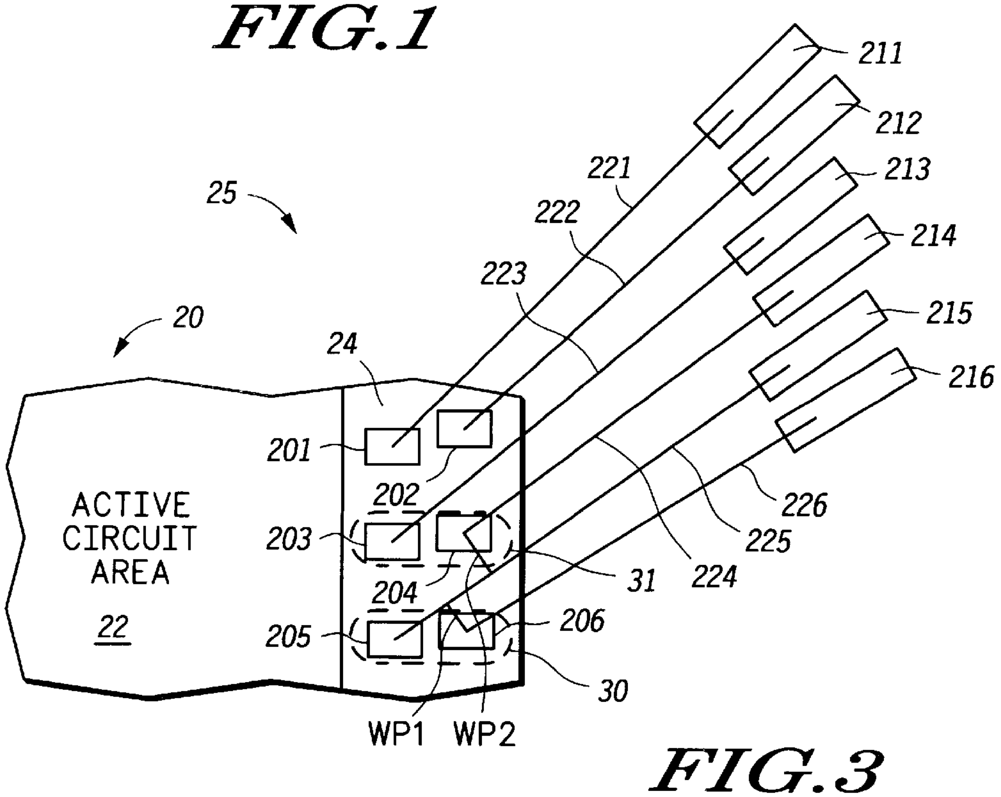
FIG. 3 illustrates a portion of the octant of FIG. 2, where the bond pads have been connected to bond posts of a package.

FIGS. 3 illustrates a specific embodiment of the present invention where the die 20 has been wire bonded to a package to form a packaged device 25. The device 25 illustrates a dual constant wire pitch device. Dual constant wire pitching is best understood by first analyzing pads within individual sets. For example, FIG. 3 illustrates set 30, which includes bond pads 205 and 206, and set 31, which includes bond pads 203 and 204. Within set 30, bond pads 205 and 206 have a wire pitch of WP1. Note: that WP1 is the orthogonal distance between the center of bond pad 206 and the wire 225. In the present embodiment of the present innovation, the distance WP1, is the same for all adjacent bond pads for all sets. Therefore, the bond pads 203 and 204 associated with set 31 will also have the wire pitch value of WP1. The second of the dual wire pitches, is derived by analyzing bond pads which are adjacent but in different sets. For example, bond pad 205, which belongs to set 30, and bond pad 204, which is in set 31, are considered adjacent bond pads because the posts in which they are bonded to are adjacent. Therefore, the wire pitch WP2 is the orthogonal distance between the center of bond pad 204 and the wire 225. The pitch WP2 is repeated between adjacent pads which are in different sets. Therefore, the wire pitch between pad 202 and pad 203 would also be WP2

It has been determined that by using the dual constant wire pitch as put forth in this disclosure, it is possible to obtain substantial area savings while still using conventional packaging techniques whereby all wire bonds would have a common loop height. This avoids the problem associated with the prior art whereby varying loop heights were used in order to bond out different rows.

Figure 4:
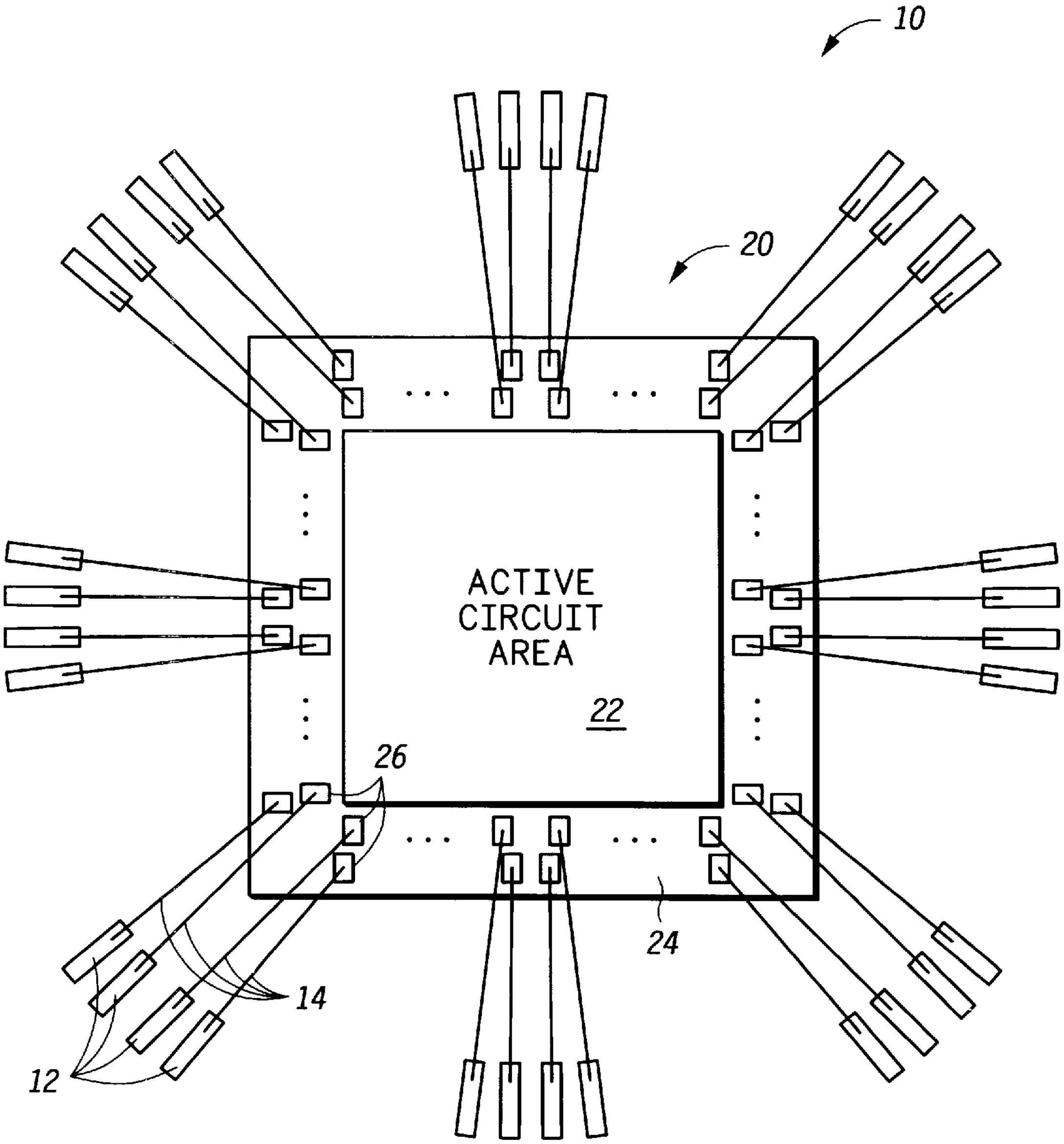
FIG. 4 illustrates the semiconductor device of FIG. 1, where the bond pads have been connected to a bond posts of a package.

It has been empirically noted that the two row dual constant wire pitch implementation of the present invention, illustrated in FIG. 4. produces die area saving of approximately 30% over a single row constant wire pitch device. In addition, it has been empirically determined that using multiple loop heights and reducing WP1 with the disclosed invention further reduces the die area. For example, it has been empirically noted that the two row dual constant wire pitch implementation of the present invention with WP1 of zero microns produces die area saving of approximately 68% over a single row constant wire pitch device.

Figure 5:
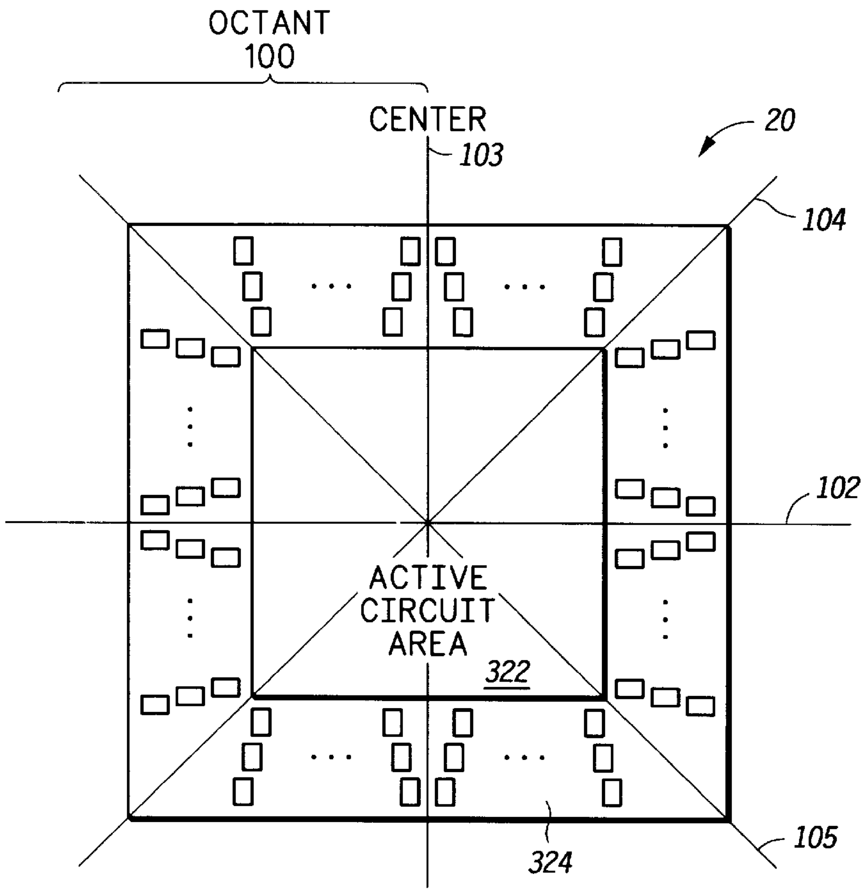
FIG. 5 illustrates a plan view of a semiconductor device divided into octants having three rows of bond pads.
Figure 6:
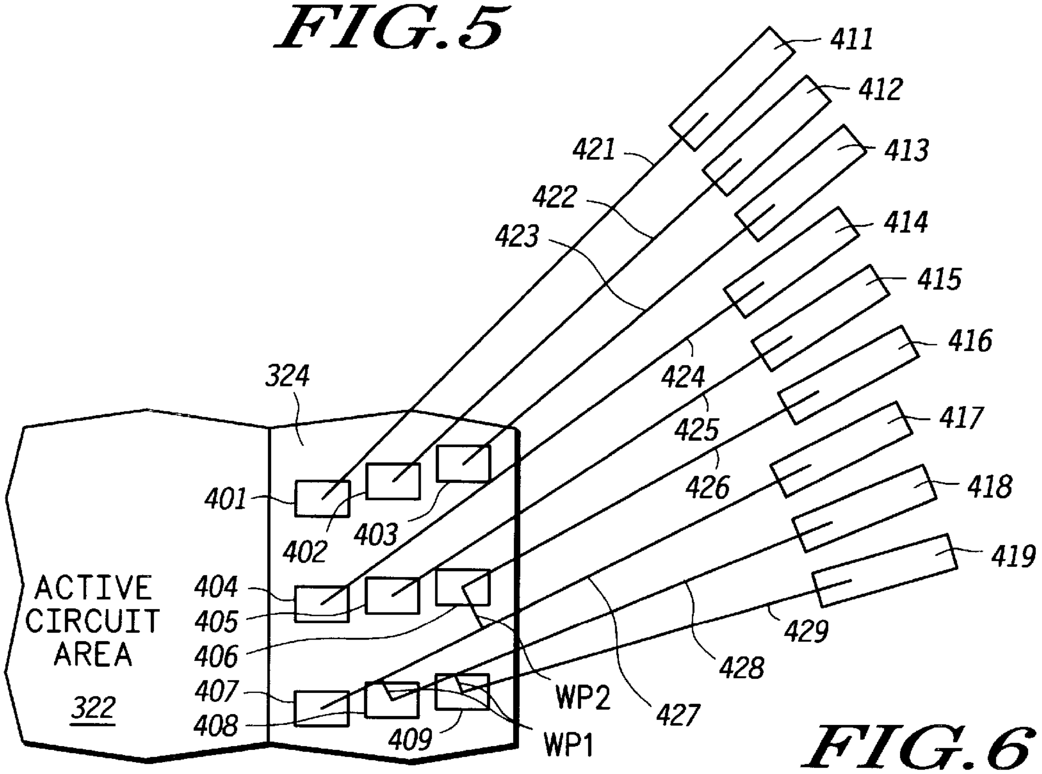
FIG. 6 illustrates a plan view of the bond pads associated with an octant of FIG. 5.
Figure 7:
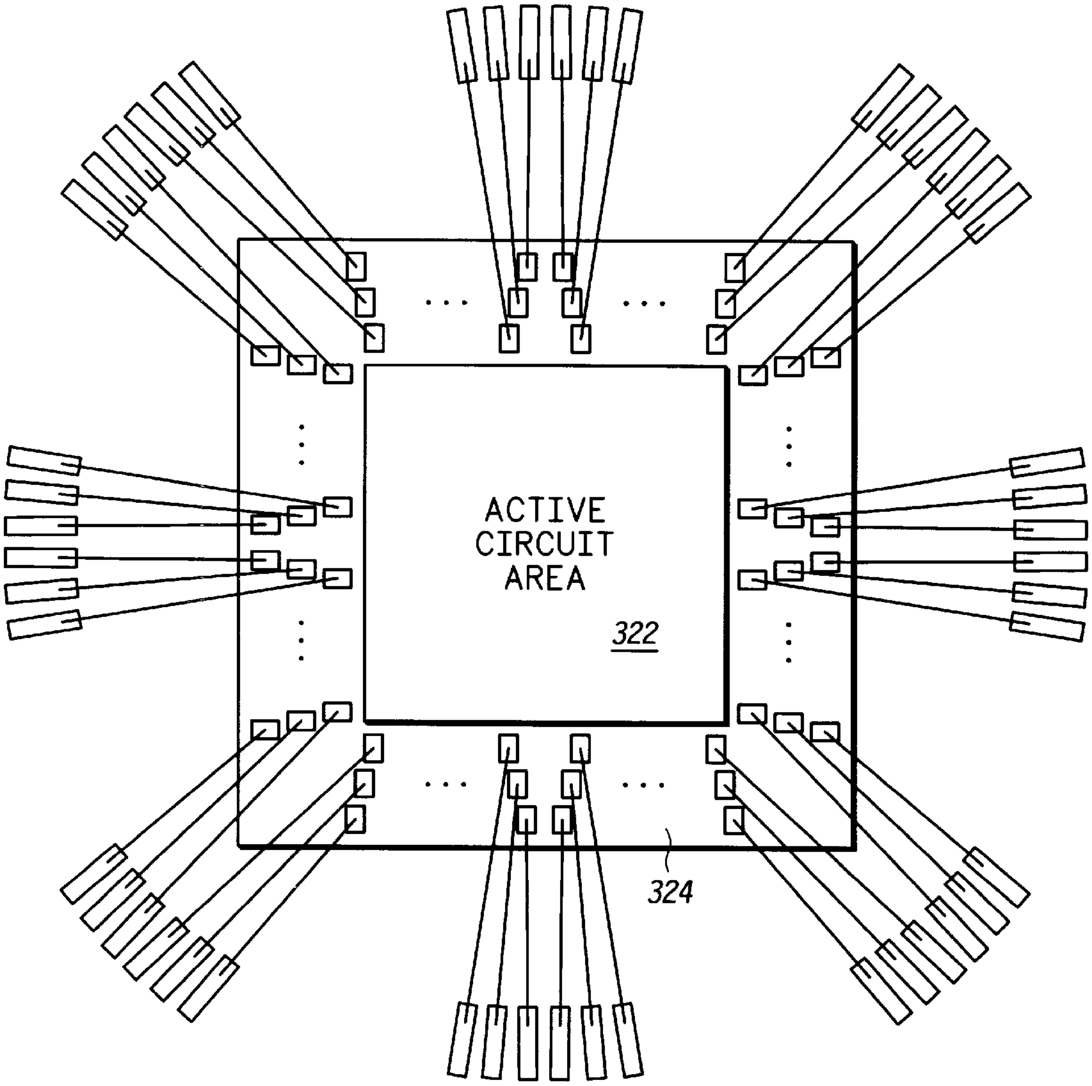
FIG. 7 illustrates the semiconductor device FIG. 5, where the bond pads have been connected to a bond posts of a package.

The discussion of the dual row embodiment extends to other multiple row embodiments. For example, as illustrated in FIGS. 5 and 6, a three row embodiment may be implemented. However, when three rows are used, a set is defined by those pads having coincident edges intersecting at least one other pad within the group.

It has been empirically noted that the three row dual constant wire pitch implementation of the present invention produces die area saving of approximately 39% over a single row constant wire pitched device. In addition, it has been empirically determined that using multiple loop heights, and reducing WP1, with the disclosed invention further reduces the die area. For example, it has been empirically noted that for the three row implementation of the present invention with WP1 equal to zero produces die area saving of approximately 81% over a single row constant wire pitch device (assuming the device does not become core limited by the logic area 22).

In addition, a dual row single constant wire pitch layout (not illustrated) has also been considered by the applicants.

However, empirical data has shown that a dual row single wire pitch layout resulted in an increase in die size over a single row constant wire pitch layout. Subsequently, it was discovered that the Dual row dual constant wire pitch design resulted in improved die size.

Figure 8:
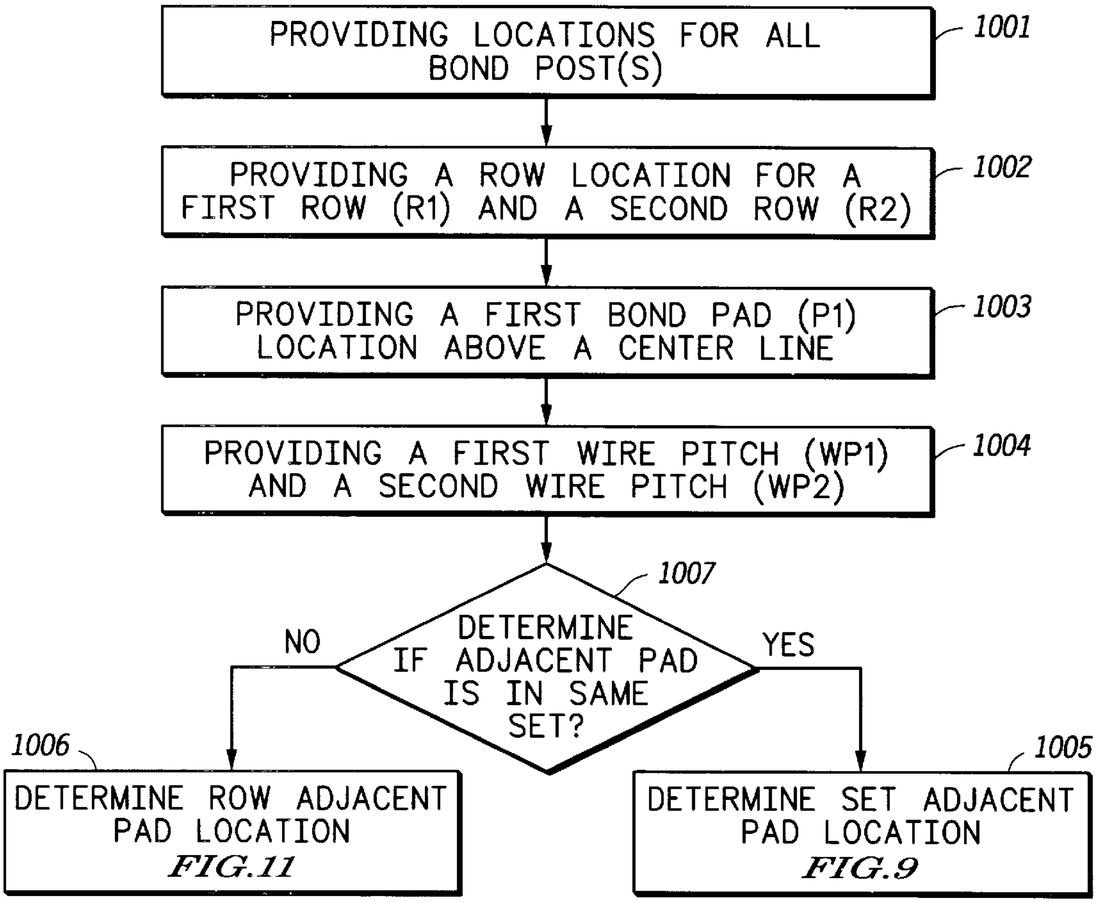
FIGS. 8, 9, and 11 illustrate a flow diagram of a method of determining pad placement for a semiconductor device.
Figure 9:
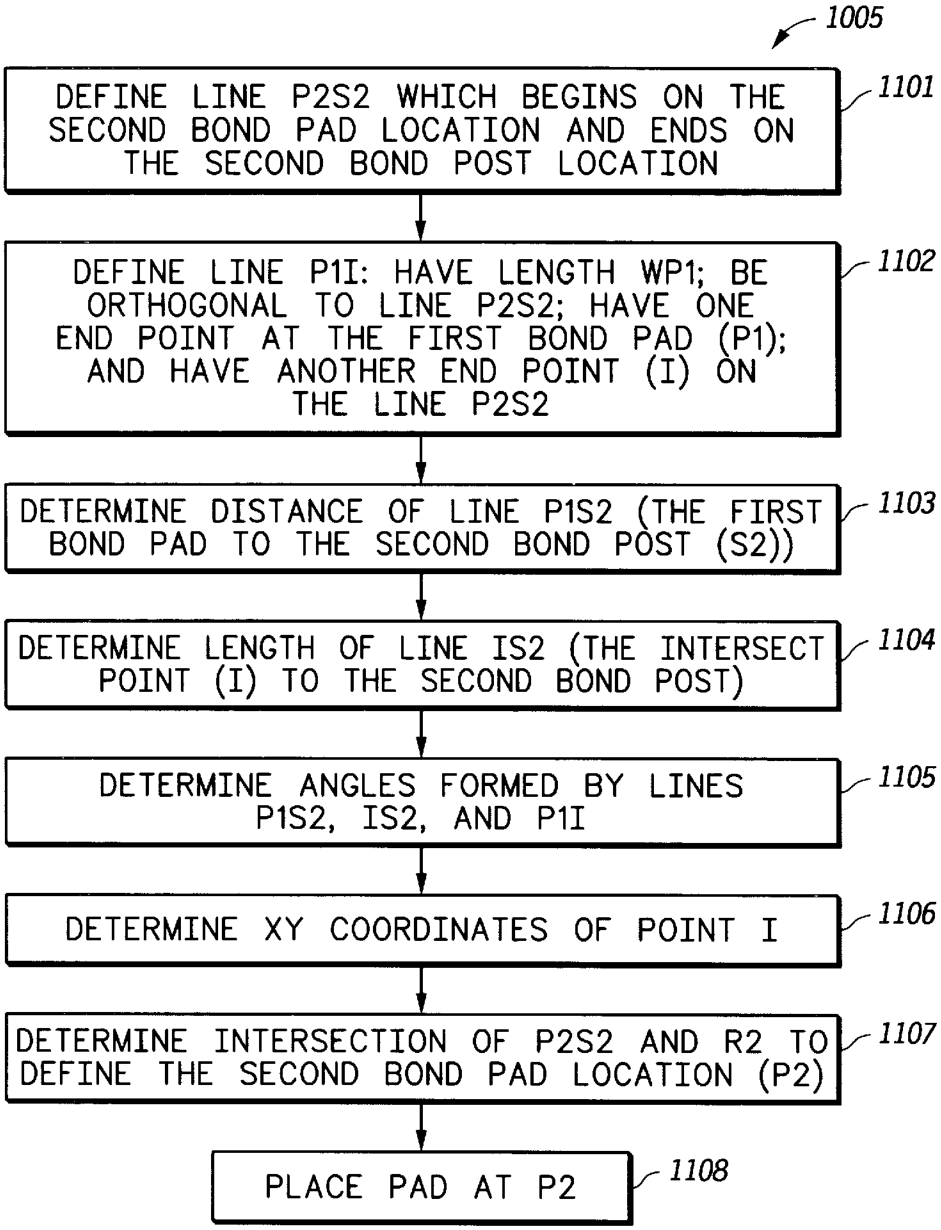
Figure 10:
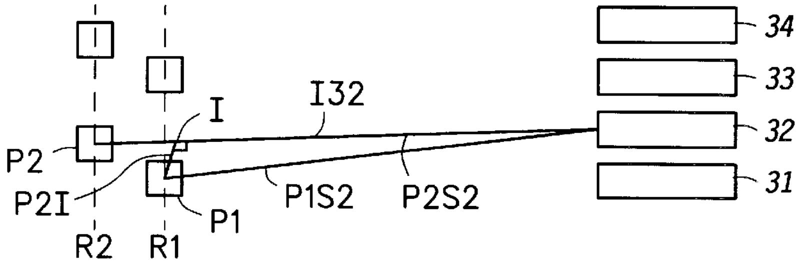
FIGS. 10 and 12 illustrate in plan view, bond pad to bond post connections supporting the method of FIGS. 8, 9, and 11.
Figure 11:
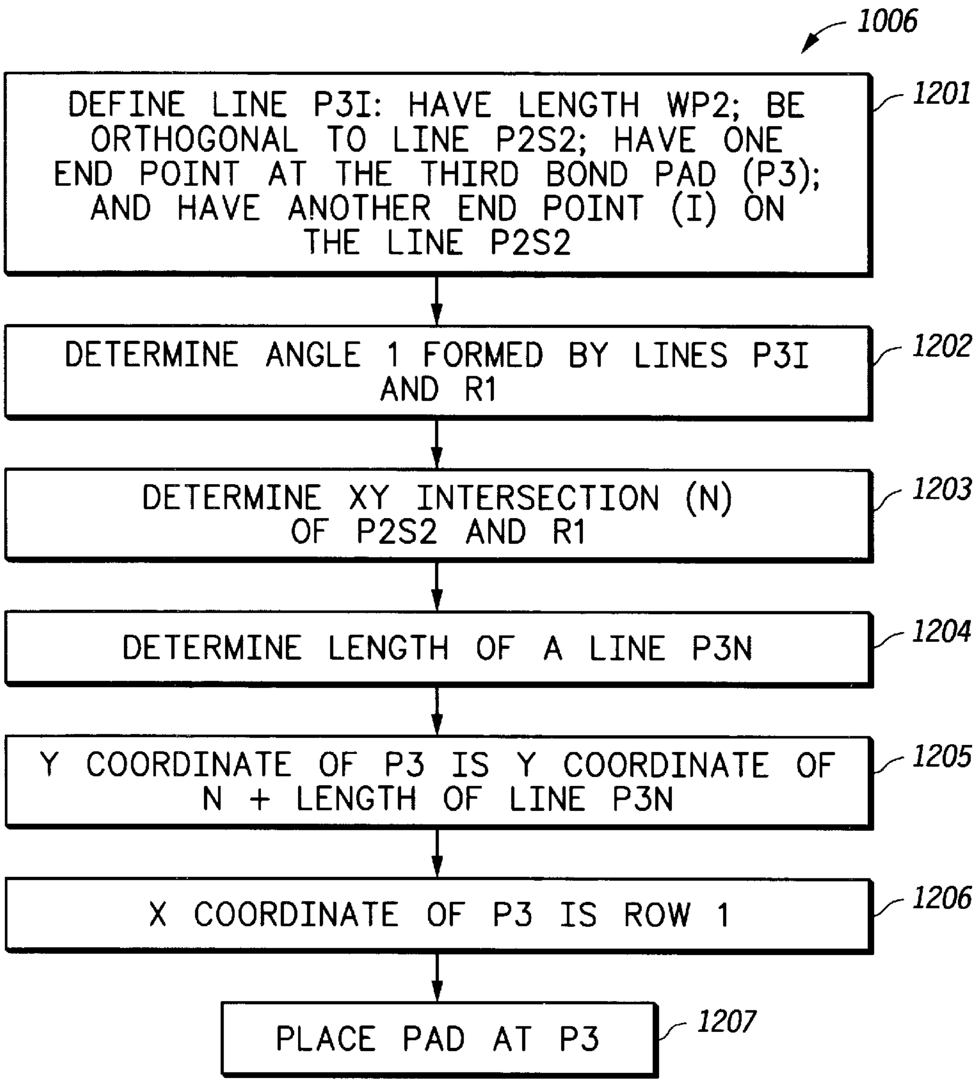

FIGS. 8, 9, and 11 illustrates a specific embodiment for a method of determining pad placement within a specific octant. The method illustrated in of FIGS. 8, 9 and 11, is best described with reference to FIGS. 10, and 12.

Figure 12:
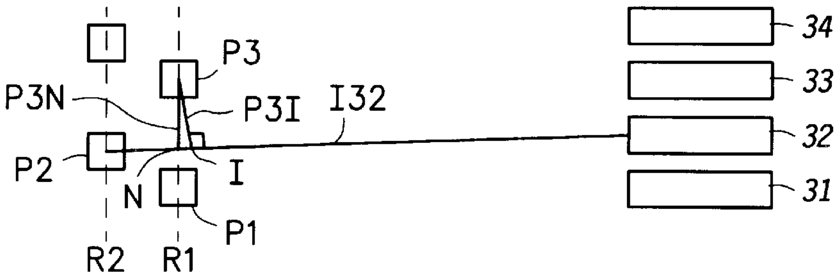

At step 1001, locations for all bond posts are provided. Generally, the locations will be provided in an XY coordinate system. At step 1002, a first and second row location (R1, R2) is provided. The first and second row location specifies an offset from the die edge for each row. R1 and R2 are illustrated in FIGS. 10 and 12 as lines passing through the center points of each pad within a row. Note that it is not important whether a center point or other reference point is used for referencing locations of the pads. Next, a first bond pad is placed at step 1003. Generally, the placement of the first bond pad will be determined by pad pitch and offset from the die edge, and the center line of the octant. In one embodiment, the offset is 150 microns. It would also be anticipated by the present invention, that the first pad could be placed overlapping the center line.

A first and second wire pitch (WP1, WP2) are defined at step 1004. Considerations which determine the choice of WP1 and WP2 include. WP2 is the smallest wire pitch based on manufacturability, since it has a direct effect on wire bond tool interference. Wire bond tool interference is not an issue with WP1, and therefore, WP1 is smaller than WP2. In one embodiment, WP1 is 50 microns, which is the same as two wire diameters, and WP2 is 80 microns. If WP1 is equal to zero, multiple loop heights would have to be used.

At step 1007, a determination is made as to whether Pad2 is a set adjacent pad or a row adjacent pad. If Pad2 is a set adjacent pad flow proceeds to step 1005. If Pad2 is a row adjacent pad, flow proceeds to step 1006.

FIG. 9 illustrates a detailed method of step 1005 for determining placement of a set adjacent pad. At step 1101 a line P2S2 is defined. As illustrated in FIG. 11, line P2S2 begins at the second bond pad location and ends on the second bond post location. It should be noted, that at step 1101 this is a definition only, because the location of the second pad is not yet known. However, certain relationships of this line are known, as will be discussed below.

At step 1102, a line P1I is defined. P1I has a length WP1 (the first wire pitch) because it is a set adjacent pad. Line P1I is orthogonal to line P2S2. Line P1I has one endpoint at the first bond pad (P1), the other endpoint (I) on line P2S2.

At step 1103, the length of line P1S2 is determined. This is the distance from Pad1 to Post1. In one embodiment, the length of line P1S2 is determined by using a distance formula and the XY coordinates of end points. At step 1104, the length of line IS2 is determined. This is the distance from the endpoint I on line P2S2 to the second bond post. In one embodiment, the distance is determined by using pythagorous theorem and triangle IP1S2. At step 1105 the angles of the triangle formed by lines P1S2, IS2, and P1I are determined given the previously described information. In one embodiment, the angles are determined by trigonometry, knowing an angle and two sides. At step 1106, the XY coordinates of point I are determined given the previously determined information. In one embodiment, the XY coordinates of point I are determined by knowing the angle of line IS2 and the XY coordinates of S2. At step 1107, an intersection of P2S2 and R2 is determined in order to define the second bond pad location (P2). In one embodiment, the intersections of P2S2 an R2 is determined by solving the equations of the two lines. Finally, at step 1108, the pad P2 is placed. Generally, the placement step will entail defining a pad placement in a semiconductor device layout database.

FIG. 11 illustrates a detail method of step 1006 for determining placement of a row adjacent pad. At step 1201 a line P2S2 is defined. As illustrated in FIG. 12, line P2S2 begins at the second bond pad location and ends on the second bond post location. At step 1202, a line P3I is defined. P3I has a length WP2 (the second wire pitch). Line P3I is orthogonal to line P2S2. Line P3I has one endpoint at the third bond pad (P3), the other endpoint (I) on line P2S2. Since the final placement of Pad3 has not yet been determined the actual XY coordinate of line P3I is not yet known. At step 1203, the XY intersection (N) of line P2S2 and R1 is determined. In one embodiment, the XY intersection is determined by knowing the X coordinate of R1 and the equation of line P2S2. At step 1204, the length of line P3N is determined. At step 1205, the line P3N is the line from Pad3 to the point N on line P2S2. In one embodiment, the length of line P3N is determined by WP2 divided by the cosine of angle 1 from step 1202. At step 1206, the Y coordinate of Pad3 is determined by adding the Y coordinate of N and the length of line P3N.

Once the layout for a given octant is determined, it can be duplicated either directly, or through flipping or mirroring techniques to provide the bond pad layout for the other octants of the die.

Although the invention has been described and illustrated with reference to specific embodiments, it is not intended that the invention be limited to those illustrative embodiments. Those skilled in the art will recognize that modifications and variations may be made without departing from the spirit and scope of the invention. Therefore, it is intended that this invention encompass all of the variations and modifications as fall within the scope of the appended claims.

What is claimed is:

1. A semiconductor device comprising:

a die having four sides:

a first side of the die having:

a first row of bond pads positioned substantially along a first axis offset from and parallel to the first side of the die by a first distance:

a second row of bond pads positioned substantially along a second axis offset from and parallel to the first side of the die by a second distance which is greater than the first distance;

wherein each bond pad of the first row has a first and a second side substantially perpendicular to the first side of the die.

each bond pad of the second row has a first and a second side substantially perpendicular to the first side of the die, the first side of each bond pad of the second row forming a pad placement axes, each pad placement axes intersecting a corresponding bond pad associated with the first row of bond pads where the pad placement axes is not coincident with the first or second side of the corresponding bond pad.

2. The semiconductor device of claim 1 further comprising:

a plurality of conductive interconnects, each of the conductive interconnects electrically contacting a predetermined one of the bond pads of the first and second rows and extending from the side of the die external to the die for electrical contact to the circuitry, the plurality of conductive interconnects being positioned in substantially the same plane.

3. The semiconductor device of claim 1 wherein the four sides of the die form eight sections and within each of the eight sections there is a pitch between each bond pad in each row, the pitch being a distance between centers of adjacent bond pads, wherein for each row the pitch varies within a single section from a beginning bond pad of the section to a last bond pad of the section.

4. The semiconductor device of claim 3 wherein at least a portion of the of the plurality of wires extend from the side of the die at an angle other than substantially orthogonal to the side of the die.

5. The semiconductor device of claim 2 wherein the plurality of conductive interconnects is a plurality of wires which form wire bonds looped between the bond pads and a plurality of bond posts which are offset from the side of the die, each wire which is looped between a predetermined bond pad and a predetermined bond post having a substantially same loop height referenced from the plane containing the conductive interconnects.

6. The semiconductor device of claim 2 wherein the plurality of conductive interconnects is a plurality of wires which form wire bonds between the bond pads and a plurality of bond posts which are positioned along the side of the die, and wherein the adjacent wire bonds of the first and second rows which are coincident with each other form sets of wire bonds, each wire bond set having a first wire pitch defining distance between wires in the wire bond set, and adjacent wires between sets having a second wire pitch, the first wire pitch being less than the second wire pitch along all of the side of the die.

7. The semiconductor device of claim 1 further comprising a third row of bond pads for each section of the device to form sets of bond pads containing a bond pad from each row, wherein within each set a third row bond pad is positioned more toward a center of the section than a second row bond pad, and a second row bond pad is positioned more toward the center of the section than the first row bond pad.

8. The semiconductor device of claim 6 wherein in each section a beginning bond pad of the section is located at substantially a center line of one of the four sides of the die and the last bond pad of the section is located at substantially a corner of the die, the pitch between each bond pad sequentially increasing from the center line to the corner within the first row of bond pads.

9. The semiconductor device of claim 3 wherein in each section pitch variation between each bond pad of the first row differs from pitch variation of the second row.

10. The semiconductor device of claim 3 further comprising a third row of bond pads for each section of the device, each bond pad of the third row being associated with a corresponding bond pad of each of the first and second rows, wherein a pitch between centers of associated bond pads of the first, second and third rows is substantially the same.

11. A semiconductor device comprising:

a die having a plurality of bond pads located around an outer perimeter, the bond pads being placed in at least first, second and third parallel rows displaced from the outer perimeter such that the third row is farther from the outer perimeter than the second row which is farther than first row from the outer perimeter, the bond pads forming a sets of bond pads having a bond pad from the first, second and third rows, within each set a bond pad of the third row is positioned closer to a center of the section of bond pads than a bond pad of the second row of the set, and the bond pad of the second row is closer to the center of the section of bond pads than a bond pad of the first row.

12. The semiconductor device of claim 11 further comprising:

a plurality of conductive interconnects which make electrical connection to selective ones of the bond pads of the first, second and third rows, all the conductive interconnects being substantially in a same plane.

13. The semiconductor device of claim 11 further comprising:

a plurality of wire bonds which make electrical connection to selective ones of the bond pads of the first, second and third rows, wires of the wire bonds associated with each set of bond pads having a first pitch which is the same within each set but which may vary from set to set, and wires adjoining each set having a second pitch which may vary from set to set boundaries, the second pitch always being greater than the first pitch within any section of bond pads.

14. The semiconductor device of claim 11 wherein within each of the sections of bond pads there is a pitch between each bond pad in each of the first, second and third rows, the pitch being a distance between centers of adjacent bond pads, wherein for each row the pitch varies within a same section from a beginning bond pad of the section to a last bond pad of the same section.

15. A semiconductor device comprising:

a die having a first edge and a second edge, wherein the first edge is substantially orthogonal to the second edge;

a first row of bond pads positioned along a first axis substantially parallel with the first edge of a semiconductor die, the first row including a first pad and a second pad;

a second row of bond pads, including a third pad and a fourth pad, positioned along a second axis substantially parallel with the first edge of a semiconductor die, where the second axis is located further from the edge that the first axis, the first row including a third pad and a fourth pad;

wherein each of the first, second, third, and fourth bond pads have a first and second edge substantially parallel to the second edge of the die, and the first edge of each of the first, second, third, and fourth bond pads is closer to the second edge of the die than the respective bond pad's second edge;

wherein an axis coincident to the second edge of the first bond pad intersects the third bond pad while an axis coincident to the first edge of the first bond pad does not intersect the third bond pad, and an axis coincident to the first edge of the second bond pad intersects the fourth bond pad while an axis coincident to the first edge of the first bond pad does not intersect the fourth bond pad.

16. A semiconductor device comprising:

a die having a first edge;

a first and a second bond pad associated with the first edge, the first bond pad between the second bond pad and the edge, and having a first and second edge perpendicular to the first edge of the die, wherein only one of an axis coincident with the first edge of the first bond pad and an axis coincident the second edge of the first bond pad intersects the second bond pad.

* * * * *

UNITED STATES PATENT AND TRADEMARK OFFICE
CERTIFICATE OF CORRECTION

PATENT NO. : 5,962,926 
DATED : October 5, 1999
INVENTOR(S) : Victor Manuel Torres, Ashok Srikantappa, Sharma Laxminarayan It is certified that error appears in the above-identified patent and that said Letters Patent is hereby corrected as shown below:

Column 6, claim 1,
Lines 58, 59, and 61, change "axes" to -- axis --

Column 7, claim 11,
Line 63, insert "the" before -- first --
Line 64, delete the first occurrence of "a"

Signed and Sealed this

Twenty-seventh Day of November, 2001

*Attest:*

NICHOLAS P. GODICI

*Attesting Officer* *Acting Director of the United States Patent and Trademark Office*